(12) United States Patent
Kagaya

(10) Patent No.: US 10,250,260 B2
(45) Date of Patent: Apr. 2, 2019

(54) DATA COMMUNICATION SYSTEM AND SEMICONDUCTOR DEVICE

(71) Applicant: SEIKO EPSON CORPORATION, Shinjuku-ku, Tokyo (JP)

(72) Inventor: Ryuichi Kagaya, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/811,057

(22) Filed: Nov. 13, 2017

(65) Prior Publication Data

US 2018/0138908 A1    May 17, 2018

(30) Foreign Application Priority Data

Nov. 14, 2016 (JP) .................................. 2016-221235

(51) Int. Cl.
  *H03K 19/013* (2006.01)
  *H03K 17/16* (2006.01)
  *H03K 19/017* (2006.01)
(52) U.S. Cl.
  CPC ....... *H03K 19/0136* (2013.01); *H03K 17/166* (2013.01); *H03K 19/01721* (2013.01)
(58) Field of Classification Search
  CPC ............. H03K 19/0136; H03K 17/166; H03K 19/01721
  See application file for complete search history.

(56) References Cited

U.S. PATENT DOCUMENTS 6,650,174 B2    11/2003  Bell
2011/0208885 A1*  8/2011  Kwek ................. G06F 13/4072
                                                710/107

FOREIGN PATENT DOCUMENTS

JP        2000-101407 A    4/2000

* cited by examiner

*Primary Examiner* — Daniel C Puentes
(74) *Attorney, Agent, or Firm* — Oliff PLC

(57) ABSTRACT

A data communication system has a first data communication circuit for outputting a clock signal to a clock signal line, receiving data input from a data signal line, and outputting data as open drain output to the data signal line, a second data communication circuit for receiving input of a clock signal from the clock signal line, receiving input of data from the data signal line, and outputting data as open drain output to the data signal line, a first pull-up resistor connected between the data signal line and the wiring of a power supply potential, a second pull-up resistor for selectively pulling up the data signal line, and a pull-up control circuit that is connected to the second pull-up resistor, and strengthens pull-up of the data signal line at least in response to a clock signal.

15 Claims, 6 Drawing Sheets

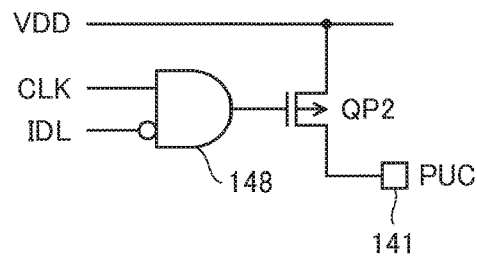
FIG. 10
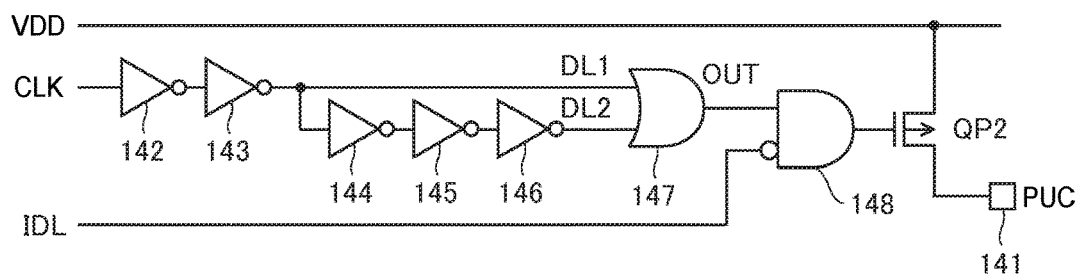
FIG. 11
FIG. 12

DATA COMMUNICATION SYSTEM AND SEMICONDUCTOR DEVICE

This application claims the benefit of the Japanese Patent Application No. 2016-221235, filed on Nov. 14, 2016. The content of the aforementioned application is incorporated herein by reference in its entirety.

BACKGROUND

1. Technical Field

The present invention relates to a data communication system for transferring data using a data signal line and a clock signal line. Furthermore, the present invention relates to a semiconductor device and the like used in such a data communication system.

2. Related Art

Various data communication systems are used for data transfer between a plurality of devices in an electronic apparatus. As such data communication systems, serial data communication systems compliant with an $I^2C$ (I squared C) bus specification are known, for example. The $I^2C$ bus is a very simple interface bus constituted by two signal lines, namely, a data signal line and a clock signal line.

In the $I^2C$ bus, a signal line to which a pull-up resistor is connected is usually driven by an open drain circuit or an open collector circuit of a transistor. In that case, when the transistor is turned on, a low level potential is output to the signal line by the transistor, and when the transistor is turned off, a high level potential is supplied to the signal line via the pull-up resistor.

The transition time between these low level and high level is a factor for determining the communication speed. In transition from a high level to a low level, on-resistance of the transistor is small, and thus even if the signal line has a parasitic capacitance, electric charges charged in the parasitic capacitance of the signal line are discharged rapidly. On the other hand, in transition from a low level to a high level, electric charges are charged in the parasitic capacitance of the signal line via the pull-up resistor, and thus the transition time is determined according to the time constant of the pull-up resistor and the parasitic capacitance of the signal line.

Therefore, it is conceivable to reduce the resistance value of the pull-up resistor in order to improve the communication speed, but increase in a pull-up current and the decrease in driving performance of the transistor, which prevents a low level potential from becoming the power supply potential on the lower potential side (e.g., 0 V), become problems. In this manner, improvement in the communication speed is contradictory to and is in the relationship of trade-off with the reduction in electronic current consumption and the improvement in reliability of communication.

As a relevant technique, JP-A-2000-101407 discloses a pull-up circuit aiming to improve the data signal speed by shortening the rise time of an open drain signal without compromising the noise margin or the electrical power efficiency. This pull-up circuit is provided with a circuit for monitoring the slew rate of a signal on an open drain signal line and a circuit for providing a pull-up current to the open drain signal line in response to the monitored slew rate.

JP-A-2000-101407 (paragraphs 0012, 0013, 0046, 0065 and 0066, and FIG. 3) is an example of related art.

In a suitable embodiment of JP-A-2000-101407, the circuit for monitoring the slew rate (dV/dt) of a signal is provided, and a higher pull-up current is provided only when the signal voltage exceeds a threshold while the signal transitions from a low level to a high level, and the slew rate is positive, for example.

However, according to the pull-up circuit of JP-A-2000-101407, pull-up is not strengthened until the signal voltage reaches the threshold, and thus no effect is acquired, contributing to the increase in communication speed insufficiently. In addition, the timing when the signal voltage exceeds the threshold depends on voltage drop between the base and emitter of the transistor 43 shown in FIG. 3 of JP-A-2000-101407, and thus the signal voltage at which an effect is acquired varies. Furthermore, the configuration of the pull-up circuit becomes complicated, thus increasing the cost.

SUMMARY

In view of this, a first advantage of some aspects of the invention is to provide a data communication system that can increase the communication speed by shortening the transition time when data transitions from a low level to a high level without increasing the electronic current consumption very much. Also, a second advantage of some aspects of the invention is to realize control of the pull-up state of a data signal line with a simple circuit configuration in such a data communication system. Furthermore, a third advantage of some aspects of the invention is to provide a semiconductor device and the like used in such a data communication system.

In order to solve at least a portion of the above issues, a data communication system according to a first aspect of the invention includes a clock signal line for transmitting a clock signal, a data signal line for transmitting data, a first data communication circuit for outputting a clock signal to the clock signal line, and receiving input of data from the data signal line, or outputting data as open drain output or open collector output to the data signal line, a second data communication circuit for receiving input of a clock signal from the clock signal line, and receiving input of data from the data signal line, or outputting data as open drain output or open collector output to the data signal line, a first pull-up resistor connected between the data signal line and a wiring of a power supply potential on a higher potential side, a second pull-up resistor for selectively pulling up the data signal line, and a pull-up control circuit that is connected to the second pull-up resistor, and strengthens pull-up of the data signal line at least in response to the clock signal.

According to the first aspect of the invention, the pull-up control circuit connected to the second pull-up resistor strengthens pull-up of the data signal line at least in response to a clock signal, and thereby the data signal line is pulled up via the first pull-up resistor, and is pulled up via the second pull-up resistor. The timing when data transitions from a low level to a high level is synchronized with the clock signal, and thus it is possible to shorten a transition time when data transitions from a low level to a high level without increasing the electronic current consumption very much, by strengthening pull-up of the data signal line in response to the clock signal. As a result, the communication speed can be increased.

Here, one end of the second pull-up resistor may be connected to the data signal line, and when a power supply potential on a higher potential side is supplied, the pull-up control circuit may output a pull-up control signal at a high level to the other end of the second pull-up resistor at least in response to a clock signal. Pull-up of the data signal line can be strengthened at least in response to the clock signal by pulling up the data signal line using such a pull-up control signal.

In that case, the pull-up control circuit may include a switch circuit that is connected between a wiring of the power supply potential on the higher potential side and the other end of the second pull-up resistor, and is turned on at least in response to a clock signal. For example, the switch circuit may include a P-channel transistor having a source connected to the wiring of the power supply potential on the higher potential side and a drain connected to the other end of the second pull-up resistor. Accordingly, control of the pull-up state of the data signal line can be realized with a simple circuit configuration.

In addition, the pull-up control circuit may output a pull-up control signal at a high level when a clock signal is at a low level. When the duty ratio of the clock signal is about 50%, a period for which the pull-up control signal at a high level is output is about 50% of a data communication period. In addition, for a period for which data is at a high level, a pull-up current does not flow. Therefore, increase in the electronic current consumption can be suppressed by shortening a period during which the pull-up current increases.

Alternatively, when a first predetermined period has elapsed after a clock signal changed to a low level, the pull-up control circuit may start outputting a pull-up control signal at a high level, and when a second predetermined period has elapsed after the clock signal changed to a low level, stop outputting the pull-up control signal at a high level. Thereby, the period during which the pull-up current increases can be further shortened.

Furthermore, the pull-up control circuit may output a pull-up control signal at a high level when the first data communication circuit sets an idle state. For example, the first data communication circuit may activate an idle state signal before setting the idle state after data communication ends, and the pull-up control circuit may output a pull-up control signal at a high level in response to the idle state signal. Accordingly, an interval until the next communication is started can be shortened by shortening the transition time when data transitions from a low level to a high level in order to set the idle state, without increasing the electronic current consumption very much.

In the above configuration, the first data communication circuit may output a clock signal to the clock signal line by push-pull driving. This makes it possible to shorten a transition time when the clock signal transitions from a low level to a high level, and improve the wave form of the clock signal.

In addition, the first and second data communication circuits may perform communication in accordance with an I²C (I squared C) bus communication protocol. In that case, it is possible to realize data transfer between a plurality of devices in an electronic apparatus using a very simple interface bus constituted by two signal lines, namely, a data signal line and a clock signal line.

Furthermore, the above-described data communication system may further include one first data communication circuit and a plurality of second data communication circuits. In that case, the one first data communication circuit can perform data transfer with the second data communication circuits.

A semiconductor device according to a second aspect of the invention is a semiconductor device that is used in a data communication system including a clock signal line for transmitting a clock signal and a data signal line for transmitting data, and includes a clock signal input/output circuit for receiving input of a clock signal from the clock signal line, or outputting a clock signal to the clock signal line, a data input/output circuit for receiving input of data from the data signal line, or outputting data as open drain output or open collector output to the data signal line, and a pull-up control circuit that strengthens pull-up of the data signal line at least in response to the clock signal. Note that in this application, the "input/output circuit" is a circuit that performs at least one of input and output.

According to the second aspect of the invention, the pull-up control circuit strengthens pull-up of the data signal line at least in response to a clock signal. The timing when data transitions from a low level to a high level is synchronized with the clock signal, and thus, it is possible to shorten a transition time when data transitions from a low level to a high level without increasing the electronic current consumption very much, by strengthening pull-up of the data signal line in response to the clock signal. As a result, the communication speed can be increased. Also, the cost for data communication can be reduced by reducing the number of external constituent parts.

Here, the pull-up control circuit may output a pull-up control signal at a high level from an output terminal at least in response to a clock signal in order to pull up the data signal line when a power supply potential on a higher potential side is supplied. Pull-up of the data signal line can be strengthened at least in response to a clock signal by pulling up the data signal line using such a pull-up control signal.

In that case, the pull-up control circuit may include a switch circuit that is connected between an interconnect of the power supply potential on the higher potential side and the output terminal, and is turned on at least in response to a clock signal. Accordingly, control of the pull-up state of the data signal line can be realized with a simple circuit configuration.

In addition, the pull-up control circuit may output a pull-up control signal at a high level when a clock signal is at a low level. If the duty ratio of the clock signal is about 50%, a period during which the pull-up control signal at a high level is output is about 50% of a data communication period. In addition, during a period for which data is at a high level, a pull-up current does not flow. Therefore, increase in the electronic current consumption can be suppressed by shortening a period during which the pull-up current increases.

Alternatively, the pull-up control circuit may start outputting a pull-up control signal at a high level when a first predetermined period has elapsed after a clock signal changed to a low level, and stop outputting the pull-up control signal at a high level when a second predetermined period has elapsed after the clock signal changed to a low level. Thereby, the period during which a pull-up current increases can be further reduced.

Furthermore, a configuration may be adopted in which the semiconductor device further includes a communication control circuit that controls communication operations of the clock signal output circuit and the data input/output circuit, and the pull-up control circuit outputs a pull-up control signal at a high level when the communication control circuit sets an idle state. Accordingly, an interval until the next communication is started can be shortened without increasing the electronic current consumption very much, by shortening a transition time when data transitions from a low level to a high level, in order to set the idle state.

BRIEF DESCRIPTION OF THE DRAWINGS

The invention will be described with reference to the accompanying drawings, wherein like numbers reference like elements.

FIG. 10 is a circuit diagram showing a configuration example of a pull-up control circuit in a fourth embodiment.

FIG. 11 is a circuit diagram showing a configuration example of a pull-up control circuit in a fifth embodiment.

FIG. 12 is a circuit diagram showing a portion of the configuration of a data communication system according to a sixth embodiment.

DESCRIPTION OF EXEMPLARY EMBODIMENTS

Embodiments of the invention will be described below in detail with reference to the drawings. Note that the same reference signs are assigned to the same constituent elements, and overlapping description is omitted.

First Embodiment

Figure 1:
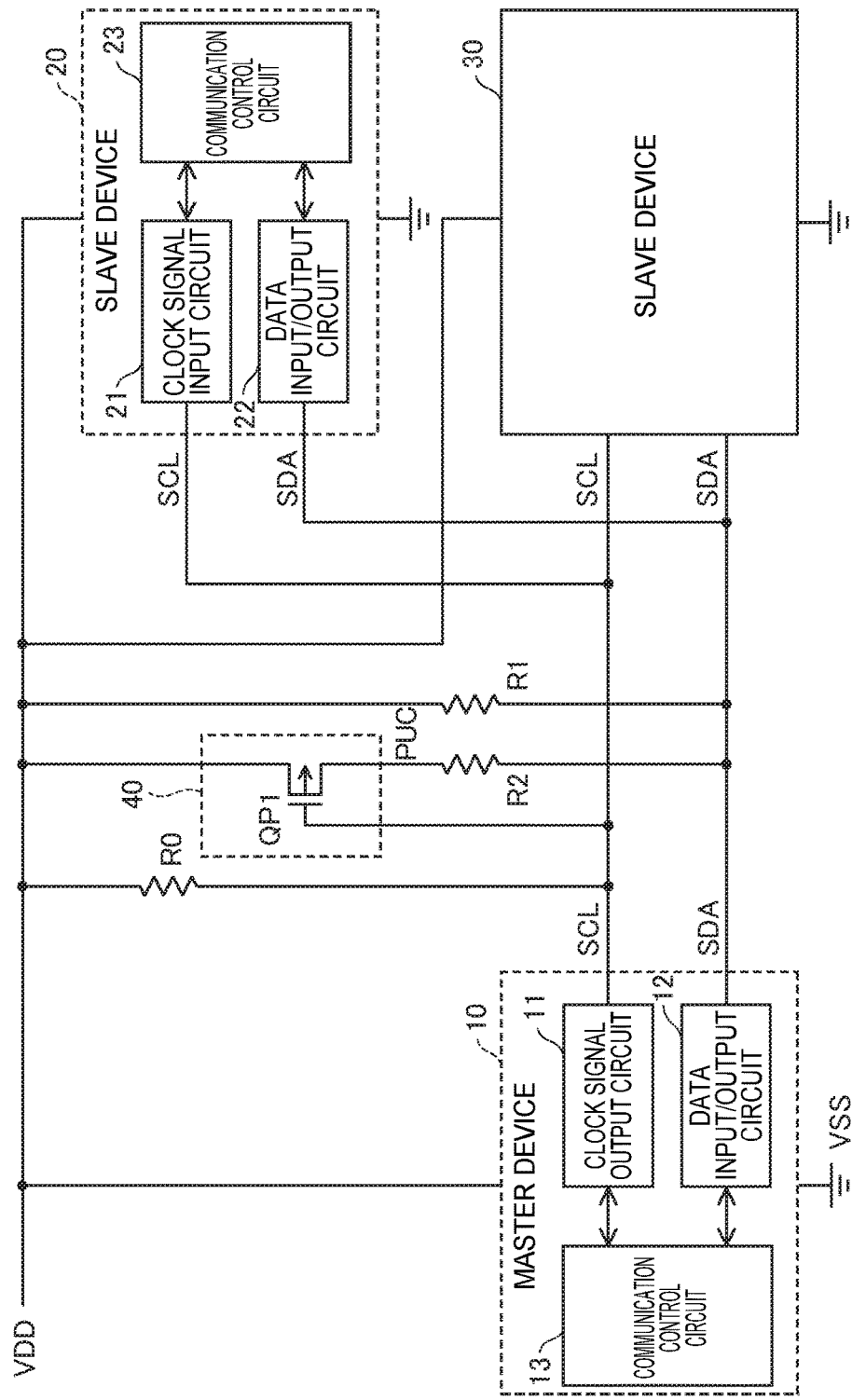
FIG. 1 is a circuit diagram showing a configuration example of a data communication system according to a first embodiment.

FIG. 1 is a circuit diagram showing a configuration example of a data communication system according to a first embodiment of the invention. As shown in FIG. 1, this data communication system includes a clock signal line SCL (serial clock line) for transmitting a clock signal, a data signal line SDA (serial data line) for transmitting data, a master device 10, at least one slave device, pull-up resistors R0 to R2, and a pull-up control circuit 40.

FIG. 1 shows a plurality of slave devices 20 and 30 as an example. In that case, one master device 10 can perform data transfer with the plurality of slave devices 20 and 30. This data communication system operates when a power supply potential VDD on the higher potential side and a power supply potential VSS on the lower potential side are supplied. The power supply potential VSS may be a ground potential (0V).

The master device 10 is a general-purpose microcomputer, for example, and includes a first data communication circuit for outputting a clock signal to the clock signal line SCL, and receiving input of data from the data signal line SDA, or outputting data as open drain output or open collector output to the data signal line SDA. The first data communication circuit has a clock signal output circuit 11, a data input/output circuit 12, and a communication control circuit 13. The communication control circuit 13 controls communication operations of the clock signal output circuit 11 and the data input/output circuit 12.

Each of the slave devices 20 and 30 is a memory such as an EEPROM, one of various sensors, or a display driver, for example, and includes a second data communication circuit for receiving input of a clock signal from the clock signal line SCL, and receiving input of data from the data signal line SDA, or outputting data as open drain output or open collector output to the data signal line SDA.

The configuration of the slave device 20 will be described below as an example. The second data communication circuit of the slave device 20 has a clock signal input circuit 21, a data input/output circuit 22, and a communication control circuit 23. The communication control circuit 23 controls communication operations of the clock signal input circuit 21 and the data input/output circuit 22.

Clock Signal Input/Output Circuit 1

Figure 2:
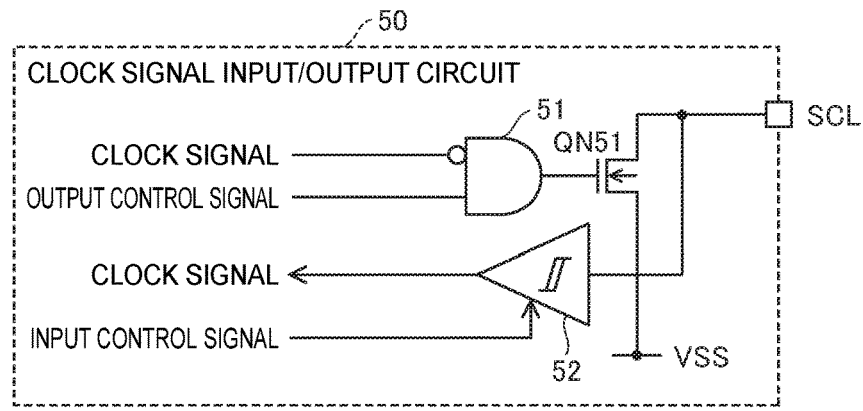
FIG. 2 is a circuit diagram showing a first configuration example of a clock signal input/output circuit.

FIG. 2 is a circuit diagram showing a first configuration example of a clock signal input/output circuit for a master device and a slave device. A clock signal input/output circuit 50 shown in FIG. 2 can be used as the clock signal output circuit 11 of the master device 10 shown in FIG. 1, and can also be used as the clock signal input circuit 21 of the slave device 20. The clock signal input/output circuit 50 includes an AND circuit 51, an N-channel MOS transistor QN51, and a Schmitt trigger circuit 52.

When the clock signal input/output circuit 50 is used in the master device 10, the communication control circuit 13 shown in FIG. 1 supplies a clock signal to an inverting input terminal of the AND circuit 51, and supplies an output control signal at a high level to a non-inverting input terminal of the AND circuit 51. Accordingly, the AND circuit 51 inverts the clock signal supplied from the communication control circuit 13, and outputs the inverted clock signal. On the other hand, if the clock signal input/output circuit 50 is used in the slave device 20, the communication control circuit 23 shown in FIG. 1 supplies an output control signal at a low level to the non-inverting input terminal of the AND circuit 51. Accordingly, the AND circuit 51 outputs an output signal at a low level.

The transistor QN51 has a gate to which the output signal of the AND circuit 51 is applied, a drain connected to the clock signal line SCL, and a source connected to an interconnect of the power supply potential VSS. If the clock signal input/output circuit 50 is used in the master device 10, the transistor QN51 inverts a clock signal that is output from the AND circuit 51, and outputs the inverted clock signal as open drain output to the clock signal line SCL. On the other hand, if the clock signal input/output circuit 50 is used in the slave device 20, the transistor QN51 brings the drain into a high impedance state.

In the clock signal input/output circuit 50 shown in FIG. 2, an NPN bipolar transistor may be used in place of the N-channel MOS transistor QN51. When the clock signal input/output circuit 50 is used in the master device 10, the NPN bipolar transistor inverts a clock signal that is output from the AND circuit 51, and outputs the inverted clock signal as open collector output to the clock signal line SCL. On the other hand, when the clock signal input/output circuit 50 is used in the slave device 20, the NPN bipolar transistor brings the collector into a high impedance state.

In addition, when the clock signal input/output circuit 50 is used in the slave device 20, the communication control circuit 23 supplies an input control signal at a high level to the Schmitt trigger circuit 52. Accordingly, the Schmitt trigger circuit 52 shapes a clock signal that is input from the clock signal line SCL, and outputs the shaped clock signal to the communication control circuit 23.

On the other hand, when the clock signal input/output circuit 50 is used in the master device 10, the communication control circuit 13 supplies an input control signal at a low level to the Schmitt trigger circuit 52. The Schmitt trigger circuit 52 thereby stops operating. Alternatively, in the master device 10, the Schmitt trigger circuit 52 may be omitted, and constituent elements other than the Schmitt trigger circuit 52 may be omitted in the slave device 20.

Clock Signal Input/Output Circuit 2

Figure 3:
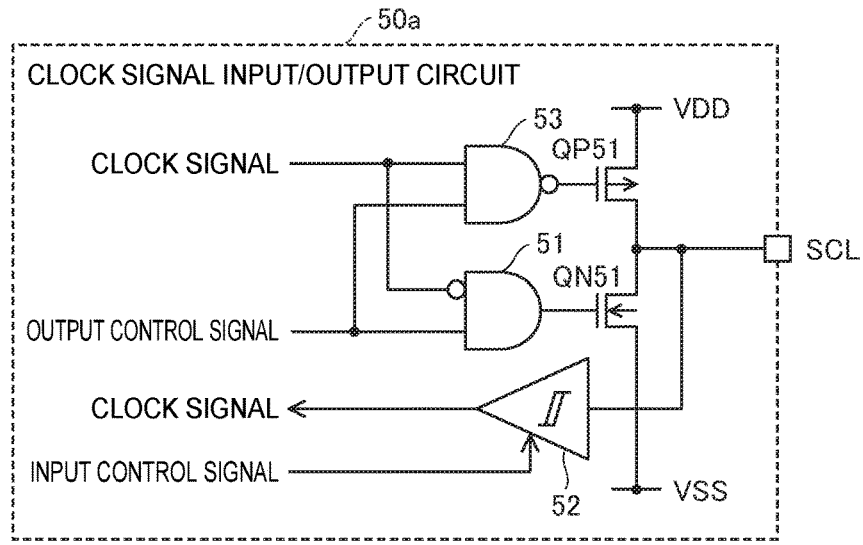
FIG. 3 is a circuit diagram showing a second configuration example of the clock signal input/output circuit.

FIG. 3 is a circuit diagram showing a second configuration example of a clock signal input/output circuit for a master device and a slave device. A clock signal input/output circuit 50*a* shown in FIG. 3 can be used as the clock signal output circuit 11 of the master device 10 shown in FIG. 1, and can also be used as the clock signal input circuit 21 of the slave device 20. The clock signal input/output circuit 50*a* includes a NAND circuit 53, the AND circuit 51, a P-channel MOS transistor QP51, the N-channel MOS transistor QN51, and the Schmitt trigger circuit 52.

If the clock signal input/output circuit 50*a* is used in the master device 10, the communication control circuit 13 shown in FIG. 1 supplies a clock signal to a first input terminal of the NAND circuit 53 and the inverting input terminal of the AND circuit 51, and supplies an output control signal at a high level to a second input terminal of the NAND circuit 53 and the non-inverting input terminal of the AND circuit 51. Accordingly, the NAND circuit 53 and the AND circuit 51 each invert the clock signal supplied from the communication control circuit 13, and outputs the inverted clock signal.

On the other hand, if the clock signal input/output circuit 50*a* is used in the slave device 20, the communication control circuit 23 shown in FIG. 1 supplies an output control signal at a low level to the second input terminal of the NAND circuit 53 and the non-inverting input terminal of the AND circuit 51. Accordingly, the NAND circuit 53 outputs an output signal at a high level, and the AND circuit 51 outputs an output signal at a low level.

The transistor QP51 has a gate to which the output signal of the NAND circuit 53 is applied, a source connected to an interconnect of the power supply potential VDD, and a drain connected to the clock signal line SCL. The transistor QN51 has a gate to which the output signal of the AND circuit 51 is applied, a drain connected to the clock signal line SCL, and a source connected to an interconnect of the power supply potential VSS.

If the clock signal input/output circuit 50*a* is used in the master device 10, the transistors QP51 and QN51 invert clock signals that are respectively output from the NAND circuit 53 and the AND circuit 51, and outputs the inverted clock signals to the clock signal line SCL by push-pull driving. On the other hand, if the clock signal input/output circuit 50*a* is used in the slave device 20, the transistors QP51 and QN51 bring their drains into a high impedance state.

In this manner, the clock signal input/output circuit 50*a* provided in the first data communication circuit outputs clock signals to the clock signal line SCL by push-pull driving, and thereby it is possible to shorten the transition time when the clock signals transition from a low level to a high level, and to improve the wave form of the clock signals.

The operation of the Schmitt trigger circuit 52 is similar to that in the first configuration example. Note that the Schmitt trigger circuit 52 may be omitted in the master device 10, and constituent elements other than the Schmitt trigger circuit 52 may be omitted in the slave device 20.

Data Input/Output Circuit

Figure 4:
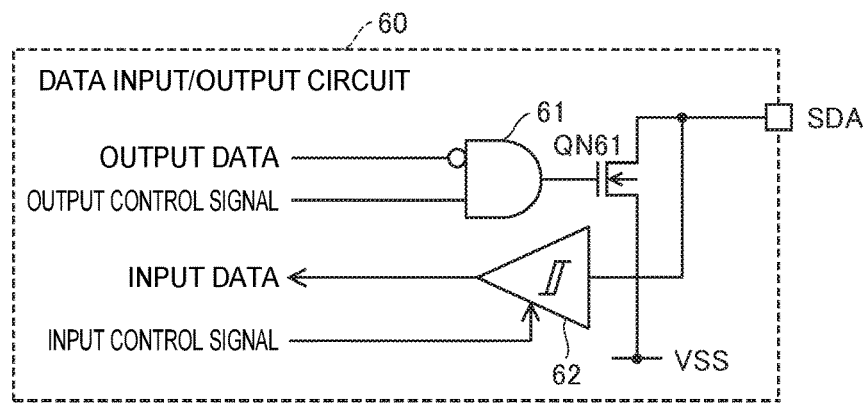
FIG. 4 is a circuit diagram showing a configuration example of a data input/output circuit.

FIG. 4 is a circuit diagram showing a configuration example of a data input/output circuit for a master device and a slave device. A data input/output circuit 60 shown in FIG. 4 can be used as the data input/output circuit 12 of the master device 10 shown in FIG. 1, and can also be used as the data input/output circuit 22 of the slave device 20. The data input/output circuit 60 includes an AND circuit 61, an N-channel MOS transistor QN61, and a Schmitt trigger circuit 62.

During data transmission, the communication control circuit 13 of the master device 10 or the communication control circuit 23 of the slave device 20 shown in FIG. 1 activates an output control signal to a high level, and inactivates an input control signal to a low level. On the other hand, during data reception, the communication control circuit 13 or 23 activates an input control signal to a high level, and inactivates the output control signal to a low level.

The AND circuit 61 has an inverting input terminal to which output data is supplied from the communication control circuit 13 or 23, and a non-inverting input terminal to which the output control signal is supplied from the communication control circuit 13 or 23. When the output control signal is activated to a high level, the AND circuit 61 inverts output data supplied from the communication control circuit 13 or 23, and outputs the inverted output data, and when the output control signal is inactivated to a low level, outputs an output signal at a low level.

The transistor QN61 has a gate to which the output signal of the AND circuit 61 is applied, a drain connected to the data signal line SDA, and a source connected to an interconnect of the power supply potential VSS. When the output control signal is activated to a high level, the transistor QN61 inverts output data that is output from the AND circuit 61, and outputs the inverted output data as open drain output to the data signal line SDA, and when the output control signal is inactivated to a low level, brings the drain into a high impedance state.

In the data input/output circuit 60 shown in FIG. 4, an NPN bipolar transistor may be used in place of the N-channel MOS transistor QN61. When the output control signal is activated to a high level, the NPN bipolar transistor inverts output data that is output from the AND circuit 61, and outputs the inverted output data as open collector output to the data signal line SDA, and when the output control signal is inactivated to a low level, brings the collector into a high impedance state.

When the input control signal is activated to a high level, the Schmitt trigger circuit 62 shapes input data that is input from the data signal line SDA, and outputs the shaped input data to the communication control circuit 13 or 23, and when the input control signal is inactivated to a low level, stops operating.

Pull-Up Circuit

Returning to FIG. 1, wired-OR connection is made between the input/output terminal of the data input/output circuit 12 of the master device 10 and the input/output terminal of the data input/output circuit 22 of the slave device 20 via the data signal line SDA. This enables bidirectional communication between the master device 10 and the slave device 20.

The pull-up resistor R0 is connected between the clock signal line SCL and the wiring of the power supply potential VDD, and the clock signal line SCL is pulled up via the pull-up resistor R0. Note that if the clock signal input/output circuit 50a having a push-pull structure as shown in FIG. 3 is used in the master device 10, the pull-up resistor R0 may be omitted.

The pull-up resistors R1 and R2 are connected as first and second pull-up resistors to the data signal line SDA. The pull-up resistor R1 is connected between the data signal line SDA and the wiring of the power supply potential VDD, and the data signal line SDA is pulled up via the pull-up resistor R1. The pull-up resistor R2 is provided for selectively pulling up the data signal line SDA.

The pull-up control circuit 40 is connected to the pull-up resistor R2, and strengthens pull-up of the data signal line SDA at least in response to a clock signal. Thereby, the data signal line SDA is pulled up via the pull-up resistor R1, and is pulled up via the pull-up resistor R2.

The timing when data transitions from a low level to a high level is synchronized with the clock signal, and thus it is possible to shorten the transition time when the data transitions from a low level to a high level without increasing the electronic current consumption very much, by strengthening pull-up of the data signal line SDA in response to the clock signal. As a result, the communication speed can be increased.

In the example shown in FIG. 1, the pull-up resistor R2 has one end connected to the data signal line SDA and the other end connected to the pull-up control circuit 40. When the power supply potential VDD is supplied, the pull-up control circuit 40 outputs a pull-up control signal PUC at a high level to the other end of the pull-up resistor R2 at least in response to the clock signal. Pull-up of the data signal line SDA can be strengthened at least in response to the clock signal, by pulling up the data signal line SDA using such a pull-up control signal PUC.

For example, the pull-up control circuit 40 may include a switch circuit that is connected between the wiring of the power supply potential VDD and the other end of the pull-up resistor R2, and is turned on at least in response to the clock signal. In the example shown in FIG. 1, the switch circuit includes a P-channel MOS transistor QP1 having a source connected to the wiring of the power supply potential VDD and a drain connected to the other end of the pull-up resistor R2. Accordingly, control of the pull-up state of the data signal line SDA can be realized with a simple circuit configuration.

In the first embodiment, the gate of the transistor QP1 is connected to the clock signal line SCL, and thus the transistor QP1 is in an on state when the clock signal is at a low level, and is in an off state when the clock signal is at a high level. Therefore, the pull-up control circuit 40 outputs the pull-up control signal PUC at a high level to the other end of the pull-up resistor R2 when the clock signal is at a low level, and brings the other end of the pull-up resistor R2 into a high impedance state when the clock signal is at a high level.

If the duty ratio of the clock signal is about 50%, the period during which the pull-up control signal PUC at a high level is output is about 50% of the data communication period. In addition, during the period for which data is at a high level, a pull-up current does not flow. Therefore, the increase in electronic current consumption can be suppressed by shortening the period during which the pull-up current increases. Moreover, the pull-up control circuit 40 in the first embodiment can also be easily applied to a data communication system in which an existing device is used, and has high practicability.

Communication Protocol

The first data communication circuit of the master device 10 and the second data communication circuit of the slave device 20 perform communication in accordance with the I$^2$C (I squared C) communication protocol, for example. In that case, data transfer between a plurality of devices in an electronic apparatus can be realized using a very simple interface bus constituted by two signal lines, namely, the data signal line SDA and the clock signal line SCL.

Figure 5:
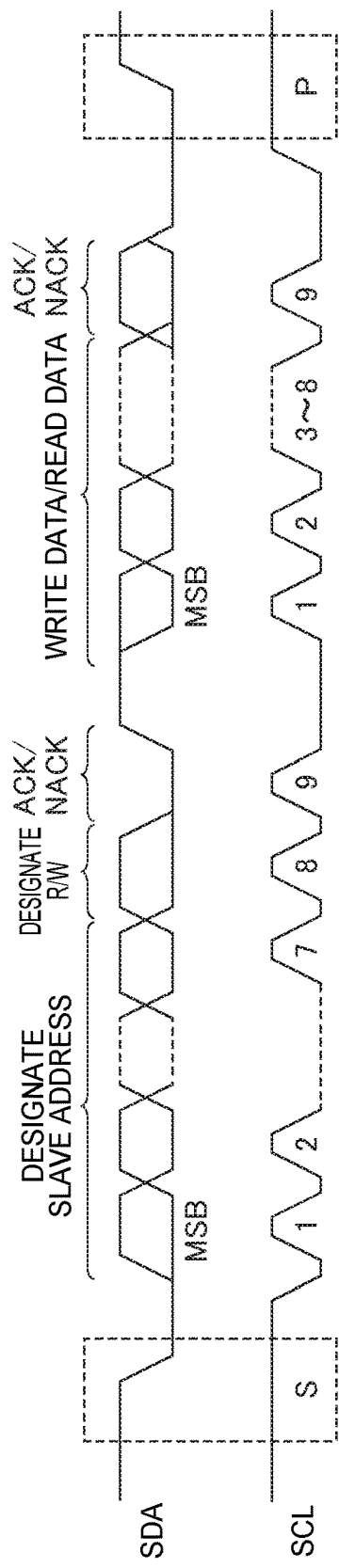
FIG. 5 is a waveform diagram for illustrating an I$^2$C bus communication protocol.

FIG. 5 is a waveform diagram for illustrating the I$^2$C bus communication protocol. The basic flow of the I$^2$C bus communication protocol will be described below with reference to FIGS. 1 and 5. In an idle state where data communication is not performed, both the data signal line SDA and the clock signal line SCL are at a high level. When starting data communication, the master device 10 generates a start condition (S) indicating that data communication will start, by changing the data signal line SDA from a high level to a low level while maintaining the clock signal line SCL at a high level.

After that, the master device 10 outputs a clock signal having a predetermined frequency to the clock signal line SCL, and outputs a seven-bit slave address and a one-bit signal (R/W) indicating the direction of the data transfer, which total to eight bit (one byte), as data to the data signal line SDA.

On the other hand, the slave devices 20 and 30 receive the data from the data signal line SDA in synchronization with the clock signal that is supplied from the clock signal line SCL, and determines whether or not the received slave address specifies the slave devices 20 and 30, respectively. In this example, it is assumed that the slave address specifies the slave device 20.

The slave device 20 specified by the slave address determines, based on the received one-bit signal (R/W), whether to receive data from the master device 10 or to transmit data to the master device 10 in subsequent data communication, and returns one-bit acknowledge (ACK) at a low level or not-acknowledge (NACK) at a high level to the master device 10.

If the one-bit signal (R/W) indicating the direction of data transfer is "0" (WRITE), eight-bit write data is transmitted from the master device 10 to the slave device 20 via the data signal line SDA. The slave device 20 that received the write data returns one-bit acknowledge (ACK) or not-acknowledge (NACK) to the master device 10.

On the other hand, if the one-bit signal (R/W) indicating the direction of the data transfer is "1" (READ), eight-bit read data is transmitted from the slave device 20 to the master device 10 via the data signal line SDA. The master device 10 that received the read data returns one-bit acknowledge (ACK) or not-acknowledge (NACK) to the slave device 20.

Basically, a transmitter can switch data to a high level or a low level when the clock signal is at a low level, and maintains the level of the data when the clock signal is at a high level. A receiver obtains the data from the data signal line SDA at the timing when the clock signal rises.

If it is determined that data communication has ended, the state machine provided in the communication control circuit 13 of the master device 10 activates an idle state signal. Thereby, the master device 10 generates a stop condition (P)

indicating that data communication has ended, by changing the data signal line SDA from a low level to a high level while maintaining the clock signal line SCL at a high level. As a result, the idle state is set in the I²C bus. In addition, the state machine of the communication control circuit 13 inactivates the idle state signal when resuming data communication.

A specification is adopted in which, when generating the stop condition (P), the level of the data signal line SDA is switched as an exception when the clock signal line SCL is at a high level, and thus in the first embodiment, when generating the stop condition (P), the rise time when data transitions from a low level to a high level cannot be improved. However, after the stop condition (P), the I²C bus is brought into the idle state, and communication stops, and thus influence on the communication quality can be prevented by sufficiently securing the interval until the next communication is started.

Second Embodiment

Figure 6:
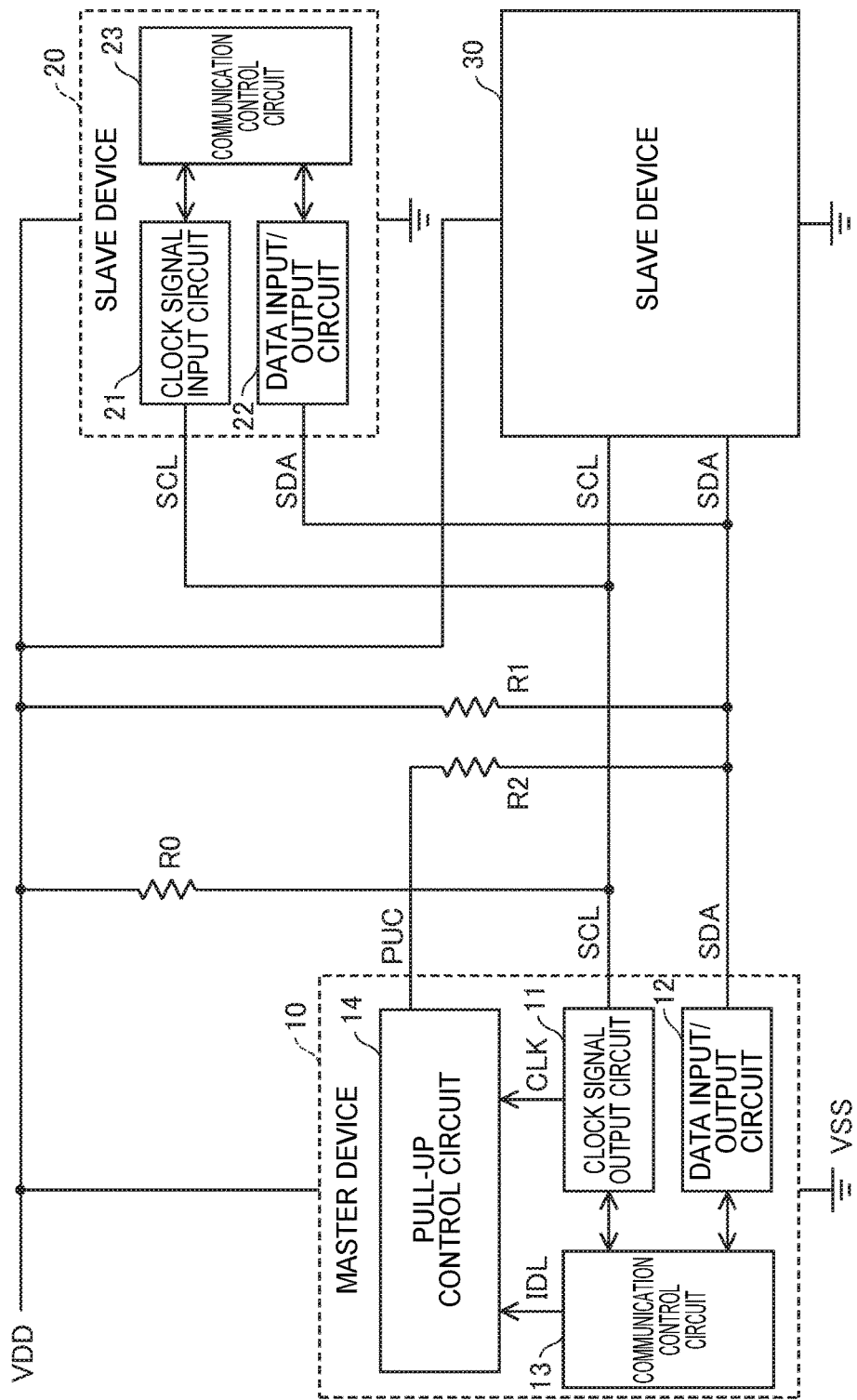
FIG. 6 is a circuit diagram showing a configuration example of a data communication system according to a second embodiment.

FIG. 6 is a circuit diagram showing a configuration example of a data communication system according to a second embodiment of the invention. In the second embodiment, the pull-up control circuit 40 in the first embodiment shown in FIG. 1 is omitted while a master device 10 includes a pull-up control circuit 14 in addition to a first data communication circuit constituted by a clock signal output circuit 11, a data input/output circuit 12 and a communication control circuit 13.

Alternatively, the pull-up control circuit 14 may be provided in a slave device 20. In the other respects, the second embodiment may be similar to the first embodiment. In addition, the master device 10 or the slave device 20 may be constituted by a semiconductor device. In that case, the cost for data communication can be reduced by reducing the number of external constituent parts.

The clock signal output circuit 11 of the master device 10 outputs a clock signal CLK to the pull-up control circuit 14 and a clock signal line SCL. The data input/output circuit 12 receives input of data from a data signal line SDA, or outputs data as open drain output or open collector output to the data signal line SDA.

A pull-up resistor R1 is connected between the data signal line SDA and the wiring of a power supply potential VDD, and the data signal line SDA is pulled up via the pull-up resistor R1. A pull-up resistor R2 is provided in order to selectively pull up the data signal line SDA. The pull-up control circuit 14 strengthens pull-up of the data signal line SDA at least in response to a clock signal. Thereby, the data signal line SDA is pulled up via the pull-up resistor R1, and is pulled up via the pull-up resistor R2.

The timing when data transitions from a low level to a high level is synchronized with the clock signal CLK, and thus the transition time when the data transitions from a low level to a high level can be shortened without increasing the electronic current consumption very much, by strengthening pull-up of the data signal line SDA in response to the clock signal CLK. As a result, the communication speed can be increased.

In the example shown in FIG. 6, the pull-up resistor R2 has one end connected to the data signal line SDA and the other end connected to the output terminal of the pull-up control circuit 14. The pull-up control circuit 14 outputs a pull-up control signal PUC at a high level from the output terminal at least in response to the clock signal CLK in order to pull up the data signal line SDA when the power supply potential VDD is supplied. Pull-up of the data signal line SDA can be strengthened at least in response to the clock signal CLK by pulling up the data signal line SDA using such a pull-up control signal PUC.

For example, the pull-up control circuit 14 may include a switch circuit that is connected between an interconnect of the power supply potential VDD and the output terminal of the pull-up control circuit 14, and that is turned on at least in response to the clock signal CLK. Accordingly, control of the pull-up state of the data signal line SDA can be realized with a simple circuit configuration.

Figure 7:
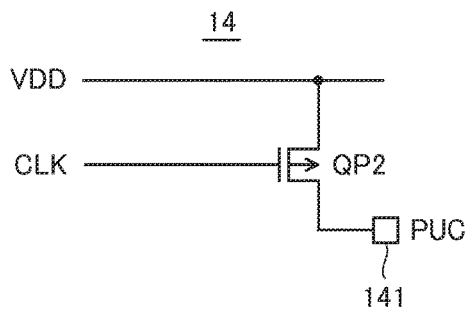
FIG. 7 is a circuit diagram showing a configuration example of a pull-up control circuit in the second embodiment.

FIG. 7 is a circuit diagram showing a configuration example of the pull-up control circuit in the second embodiment of the invention. The pull-up control circuit 14 shown in FIG. 7 includes a P-channel MOS transistor QP2 that constitutes a switch circuit. The transistor QP2 has a gate to which the clock signal CLK is applied from the clock signal output circuit 11 (FIG. 6), a source connected to an interconnect of the power supply potential VDD, and a drain connected to an output terminal 141 of the pull-up control circuit 14.

The transistor QP2 is in an on state when the clock signal CLK is at a low level, and is in an off state when the clock signal CLK is at a high level. Therefore, when the clock signal CLK is at a low level, the pull-up control circuit 14 outputs the pull-up control signal PUC at a high level from the output terminal 141, and brings the output terminal 141 into a high impedance state when the clock signal CLK is at a high level.

If the duty ratio of the clock signal CLK is about 50%, the period during which the pull-up control signal PUC at a high level is output is about 50% of the data communication period. Also, during the period for which data is at a high level, a pull-up current does not flow. Therefore, the increase in electronic current consumption can be suppressed by shortening the period during which the pull-up current increases.

Third Embodiment

Next, a third embodiment of the invention will be described. In the third embodiment, a portion of the configuration of a pull-up control circuit 14 shown in FIG. 6 is different from that in the second embodiment. In the other respects, the third embodiment may be similar to the second embodiment.

Figure 8:
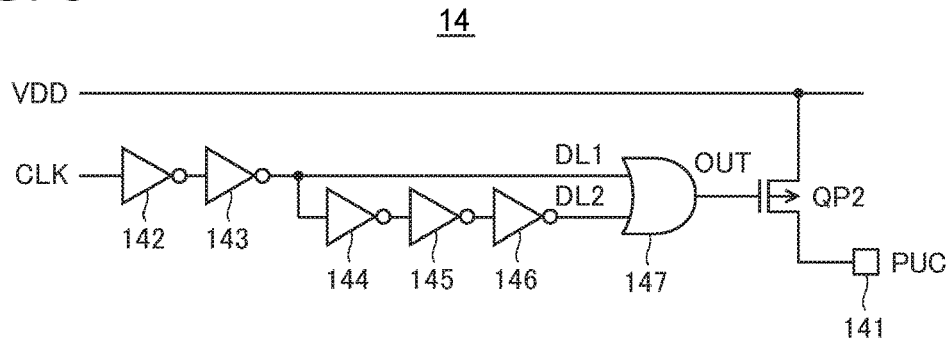
FIG. 8 is a circuit diagram showing a configuration example of a pull-up control circuit in a third embodiment.
Figure 9:
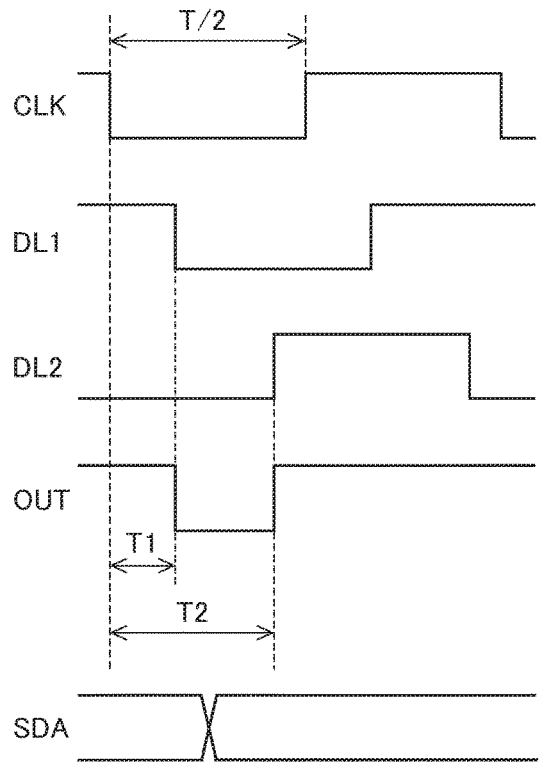
FIG. 9 is a waveform diagram showing the operation timings of the pull-up control circuit shown in FIG. 8.

FIG. 8 is a circuit diagram showing a configuration example of the pull-up control circuit in the third embodiment of the invention, and FIG. 9 is a waveform diagram showing the operation timings of the pull-up control circuit shown in FIG. 8. The pull-up control circuit 14 shown in FIG. 8 includes a plurality of inverters (in FIG. 8, inverters 142 to 146 are indicated as an example), an OR circuit 147, and a P-channel MOS transistor QP2 that constitutes a switch circuit.

As shown in FIG. 9, an even number of the inverters 142 and 143 delay, by a first predetermined period T1, a clock signal CLK supplied from a clock signal output circuit 11 (FIG. 6), and generate a first delay clock signal DL1. Also, an odd number of the inverters 142 to 146 delay, by a second predetermined period T2, the clock signal CLK supplied from the clock signal output circuit 11, invert the clock signal CLK, and generate a second delay clock signal DL2.

The OR circuit 147 has a first input terminal to which the first delay clock signal DL1 is supplied, and a second input terminal to which the second delay clock signal DL2 is supplied. As shown in FIG. 9, the OR circuit 147 outputs an output signal OUT at a low level when the first predetermined period T1 has elapsed after the clock signal CLK changed to a low level, and outputs the output signal OUT at a high level when the second predetermined period T2 has elapsed after the clock signal CLK changed to a low level.

The transistor QP2 has a gate to which the output signal OUT of the OR circuit 147 is applied, a source connected to an interconnect of a power supply potential VDD, and a drain connected to an output terminal 141 of the pull-up control circuit 14. The transistor QP2 is in an on state when the output signal OUT of the OR circuit 147 is at a low level, and is in an off state when the output signal OUT of the OR circuit 147 is at a high level.

Therefore, the pull-up control circuit 14 starts outputting a pull-up control signal PUC at a high level when the first predetermined period T1 has elapsed after the clock signal CLK changed to a low level, and stops outputting the pull-up control signal PUC at a high level when the second predetermined period T2 has elapsed after the clock signal CLK changed to a low level. Thereby, the period during which a pull-up current increases can be further shortened.

A cycle T of the clock signal CLK is expressed by T=1/f in which a frequency f of the clock signal CLK is used. As shown in FIG. 9, if the duty ratio of the clock signal CLK is 50%, the period for which the clock signal CLK is at a low level is T/2. Here, changing the level of a data signal line SDA at the center of the period for which the clock signal CLK is at a low level is adopted in general. In that case, the first predetermined period T1 and the second predetermined period T2 need to satisfy the conditions expressed by Expressions 1 and 2 below.

$$0 < T1 < T/4 \qquad\qquad 1$$

$$T/4 < T2 \leq T/2 \qquad\qquad 2$$

Furthermore, in that case, in order to shorten the output period of the pull-up control signal PUC while the period during which the level of the data signal line SDA changes is taken into consideration, the first predetermined period T1 and the second predetermined period T2 desirably satisfy the conditions expressed by Expressions 3 and 4 below.

$$0.1T \leq T1 \leq 0.2T \qquad\qquad 3$$

$$0.3T \leq T2 \leq 0.4T \qquad\qquad 4$$

Note that in a master device 10 shown in FIG. 6, if the clock signal CLK is generated, for example, by counting, using a counter, the number of pulses of a master clock signal having a frequency higher than the frequency of the clock signal CLK, the first predetermined period T1 and the second predetermined period T2 may be set by generating the output signal OUT using a signal that is output from the counter or the like.

Fourth Embodiment

Next, a fourth embodiment of the invention will be described. In the fourth embodiment, a portion of the configuration of the pull-up control circuit 14 shown in FIG. 6 is different from that in the second embodiment. In the other respects, the fourth embodiment may be similar to the second embodiment.

In the fourth embodiment, when a communication control circuit 13 of a first data communication circuit sets an idle state, the pull-up control circuit 14 shown in FIG. 6 outputs a pull-up control signal PUC at a high level. Accordingly, an interval until the next communication is started can be shortened without increasing the electronic current consumption very much, by shortening the transition time when data transitions from a low level to a high level in order to set the idle state.

FIG. 10 is a circuit diagram showing a configuration example of the pull-up control circuit in the fourth embodiment of the invention. The pull-up control circuit 14 shown in FIG. 10 includes an AND circuit 148 and a P-channel MOS transistor QP2 that constitutes a switch circuit.

The AND circuit 148 has a non-inverting input terminal to which a clock signal CLK is supplied from a clock signal output circuit 11 (FIG. 6) and an inverting input terminal to which an idle state signal IDL is supplied from a communication control circuit 13 (FIG. 6). When the clock signal CLK is at a low level, and when the idle state signal IDL is at a high level, the AND circuit 148 outputs an output signal at a low level, and otherwise outputs an output signal at a high level.

The transistor QP2 has a gate to which the output signal of the AND circuit 148 is applied, a source connected to an interconnect of a power supply potential VDD, and a drain connected to an output terminal 141 of the pull-up control circuit 14. The transistor QP2 is in an on state when the output signal of the AND circuit 148 is at a low level, and is in an off state when the output signal of the AND circuit 148 is at a high level.

The communication control circuit 13 of the first data communication circuit shown in FIG. 6 activates the idle state signal IDL to a high level, before setting the idle state after data communication ends. The pull-up control circuit 14 outputs the pull-up control signal PUC at a high level in response to the idle state signal IDL.

Therefore, when the clock signal CLK is at a low level, and when the idle state signal IDL is at a high level, the pull-up control circuit 14 outputs the pull-up control signal PUC at a high level from the output terminal 141, and otherwise, brings the output terminal 141 into a high impedance state. Accordingly, the rise time at which data of the data signal line SDA transitions can be improved under a stop condition (P) indicating that data communication ended. Note that when interface bus is in the idle state, the data signal line SDA is (changed to) at a high level, and thus pull-up current does not flow.

Fifth Embodiment

Next, a fifth embodiment of the invention will be described. In the fifth embodiment, a portion of the configuration of the pull-up control circuit 14 shown in FIG. 6 is different from that in the third embodiment. In the other respects, the fifth embodiment may be similar to the third embodiment. Also, in the fifth embodiment, similarly to the fourth embodiment, the pull-up control circuit 14 outputs a pull-up control signal PUC at a high level when a communication control circuit 13 of a first data communication circuit sets an idle state.

FIG. 11 is a circuit diagram showing a configuration example of the pull-up control circuit of the fifth embodiment of the invention. The pull-up control circuit 14 shown in FIG. 11 includes a plurality of inverters (in FIG. 11, inverters 142 to 146 are indicated as an example), an OR circuit 147, an AND circuit 148, and a P-channel MOS transistor QP2 that constitutes a switch circuit. Operations of the inverter 142 to the OR circuit 147 are similar to those in the third embodiment shown in FIG. 8, and thus description thereof is omitted.

The AND circuit 148 has a non-inverting input terminal to which an output signal OUT of the OR circuit 147 is supplied, and an inverting input terminal to which an idle state signal IDL is supplied from the communication control circuit 13 (FIG. 6). The AND circuit 148 outputs an output signal at a low level when the output signal OUT of the OR circuit 147 is at a low level, and when the idle state signal IDL is at a high level, and otherwise outputs an output signal at a high level.

The transistor QP2 has a gate to which the output signal of the AND circuit 148 is applied, a source connected to an interconnect of a power supply potential VDD, and a drain connected to an output terminal 141 of the pull-up control circuit 14. The transistor QP2 is in an on state when the output signal of the AND circuit 148 is at a low level, and is in an off state when the output signal of the AND circuit 148 is at a high level.

The communication control circuit 13 of the first data communication circuit shown in FIG. 6 activates an idle state signal IDL to a high level before setting an idle state after data communication ends. The pull-up control circuit 14 outputs the pull-up control signal PUC at a high level in response to the idle state signal IDL.

Therefore, the pull-up control circuit 14 outputs the pull-up control signal PUC at a high level from the output terminal 141 during a portion of the period for which a clock signal CLK is at a low level and during the period for which the idle state signal IDL is at a high level, and brings the output terminal 141 into a high impedance state during other periods.

Sixth Embodiment

FIG. 12 is a circuit diagram showing a portion of the configuration of a data communication system according to a sixth embodiment of the invention. In the sixth embodiment, a pull-up control circuit 40a shown in FIG. 12 is used in place of the pull-up control circuit 40 or 14 in the first to fifth embodiments. In the other respects, the sixth embodiment may be similar to the first to fifth embodiments.

In the first to fifth embodiments, the pull-up control circuit 40 or 14 is connected between the wiring of the power supply potential VDD and the other end of the pull-up resistor R2. However, in the sixth embodiment, the pull-up control circuit 40a is connected between one end of a pull-up resistor R2 and a data signal line SDA, and the other end of the pull-up resistor R2 is connected to a power supply potential VDD.

For example, the pull-up control circuit 40a is connected between one end of the pull-up resistor R2 and the data signal line SDA, and may include a switch circuit that is turned on at least in response to a clock signal. In the example shown in FIG. 12, the switch circuit includes a P-channel MOS transistor QP3, an N-channel MOS transistor QN3, and an inverter 41.

The transistor QP3 has a source connected to one end of the pull-up resistor R2, a drain connected to the data signal line SDA, and a gate connected to a clock signal line SCL. The transistor QN3 has a drain connected to one end of the pull-up resistor R2, a source connected to the data signal line SDA, and a gate connected to the output terminal of the inverter 41.

The inverter 41 inverts a clock signal that is supplied from the clock signal line SCL to the input terminal, and outputs the inverted clock signal from the output terminal. An analog switch constituted by the transistors QP3 and QN3 is in an on state when the clock signal is at a low level, and is in an off state when the clock signal is at a high level.

Alternatively, the switch circuit may be constituted only by the transistor QP3. In that case, control of the pull-up state of the data signal line SDA can be realized with a single circuit configuration. Also according to the sixth embodiment, pull-up of the data signal line SDA can be strengthened at a desired timing.

The invention is not limited to the embodiments given above, and a person having ordinary skill in the art can make many modifications within the technical concept of the invention. For example, a plurality of embodiments selected from the embodiments given above can be combined and implemented.

What is claimed is:

1. A data communication system comprising:
a clock signal line for transmitting a clock signal;
a data signal line for transmitting data;
a first data communication circuit for outputting a clock signal to the clock signal line, and receiving input of data from the data signal line, or outputting data as open drain output or open collector output to the data signal line;
a second data communication circuit for receiving input of a clock signal from the clock signal line, and receiving input of data from the data signal line, or outputting data as open drain output or open collector output to the data signal line;
a first pull-up resistor connected between the data signal line and a wiring of a power supply potential on a higher potential side;
a second pull-up resistor for selectively pulling up the data signal line, wherein one end of the second pull-up resistor is connected to the data signal line; and
a pull-up control circuit that is connected to the second pull-up resistor, wherein when a power supply potential on the higher potential side is supplied, the pull-up control circuit outputs a pull-up control signal at a high level to the other end of the second pull-up resistor at least in response to a clock signal.

2. The data communication system according to claim 1, wherein the pull-up control circuit includes a switch circuit that is connected between a wiring of the power supply potential on the higher potential side and the other end of the second pull-up resistor, and is turned on at least in response to a clock signal.

3. The data communication system according to claim 2, wherein the switch circuit includes a P-channel transistor having a source connected to the wiring of the power supply potential on the higher potential side and a drain connected to the other end of the second pull-up resistor.

4. The data communication system according to claim 1, wherein the pull-up control circuit outputs a pull-up control signal at a high level when a clock signal is at a low level.

5. The data communication system according to claim 1, wherein when a first predetermined period has elapsed after a clock signal changed to a low level, the pull-up control circuit starts outputting a pull-up control signal at a high level, and when a second predetermined period has elapsed after the clock signal changed to a low level, stops outputting the pull-up control signal at a high level.

6. The data communication system according to claim 1, wherein the pull-up control circuit outputs a pull-up control signal at a high level when the first data communication circuit sets an idle state.

7. The data communication system according to claim 1, wherein the first data communication circuit activates an idle state signal before setting the idle state after data communication ends, and the pull-up control circuit outputs a pull-up control signal at a high level in response to the idle state signal.

8. The data communication system according to claim 1, wherein the first data communication circuit outputs a clock signal to the clock signal line by push-pull driving.

9. The data communication system according to claim 1, wherein the first and second data communication circuits perform communication in accordance with an I2C (I squared C) bus communication protocol.

10. The data communication system according to claim 1, further comprising:
    one first data communication circuit and a plurality of second data communication circuits.

11. A semiconductor device that is used in a data communication system including a clock signal line for transmitting a clock signal and a data signal line for transmitting data, comprising:
    a clock signal input/output circuit for receiving input of a clock signal from the clock signal line, or outputting a clock signal to the clock signal line;
    a data input/output circuit for receiving input of data from the data signal line, or outputting data as open drain output or open collector output to the data signal line; and
    a pull-up control circuit that outputs a pull-up control signal at a high level from an output terminal at least in response to a clock signal in order to pull up the data signal line when a power supply potential on a higher potential side is supplied.

12. The semiconductor device according to claim 11, wherein the pull-up control circuit includes a switch circuit that is connected between an interconnect of the power supply potential on the higher potential side and the output terminal, and is turned on at least in response to a clock signal.

13. The semiconductor device according to claim 11, wherein the pull-up control circuit outputs a pull-up control signal at a high level when a clock signal is at a low level.

14. The semiconductor device according to claim 11, wherein the pull-up control circuit starts outputting a pull-up control signal at a high level when a first predetermined period has elapsed after a clock signal changed to a low level, and stops outputting the pull-up control signal at a high level when a second predetermined period has elapsed after the clock signal changed to a low level.

15. The semiconductor device according to claim 11, further comprising:
    a communication control circuit that controls communication operations of the clock signal output circuit and the data input/output circuit,
    wherein the pull-up control circuit outputs a pull-up control signal at a high level when the communication control circuit sets an idle state.

\* \* \* \* \*